United States Patent
Shamble et al.

[11] Patent Number: 6,121,156
[45] Date of Patent: Sep. 19, 2000

[54] CONTACT MONITOR, METHOD OF FORMING SAME AND METHOD OF ANALYZING CONTACT-, VIA-AND/OR TRENCH-FORMING PROCESSES IN AN INTEGRATED CIRCUIT

[75] Inventors: Edward M. Shamble, North Stillwater; Thomas Boonstra, Minneapolis; David J. Brownell, Eden Prairie; David A. Crow, Eagan, all of Minn.

[73] Assignee: Cypress Semiconductor Corporation, San Jose, Calif.

[21] Appl. No.: 09/204,215

[22] Filed: Dec. 2, 1998

Related U.S. Application Data

[60] Provisional application No. 60/083,347, Apr. 28, 1998.

[51] Int. Cl.[7] ........................................ H01L 21/00
[52] U.S. Cl. .................... 438/734; 438/735; 438/719; 438/714; 257/693; 257/687
[58] Field of Search .................... 438/734, 719, 438/218, 714, 735; 257/692, 693, 687

[56] References Cited

U.S. PATENT DOCUMENTS

| | | | |
|---|---|---|---|
| 5,038,711 | 8/1991 | Dan et al. | 118/715 |
| 5,144,747 | 9/1992 | Eichelberger | 29/839 |
| 5,250,843 | 10/1993 | Eichelberger | 257/692 |
| 5,274,434 | 12/1993 | Morioka et al. | 356/237 |
| 5,371,588 | 12/1994 | Davis et al. | 356/349 |
| 5,463,459 | 10/1995 | Morioka et al. | 356/237 |
| 5,634,267 | 6/1997 | Farmworth et al. | 29/840 |
| 5,640,762 | 6/1997 | Farnworth et al. | 29/833 |
| 5,644,393 | 7/1997 | Nakamura et al. | 356/237 |
| 5,796,264 | 8/1998 | Farnworth et al. | 324/758 |
| 5,914,280 | 6/1999 | Gelzins | 438/734 |
| 6,020,957 | 2/2000 | Rosengaus | 356/237 |

OTHER PUBLICATIONS

KLA—Tencor Web Site printout—The IC manufacturing Process: Deposition, dated Apr. 20, 1998.
Applied Materials Web Site printout dated Oct. 2, 1998 Process Diagnostic And Control, Products and Services.

*Primary Examiner*—Charles Bowers
*Assistant Examiner*—Laura M Schillinger
*Attorney, Agent, or Firm*—Young Law Firm, P.C.

[57] ABSTRACT

Methods for monitoring defects in a process for forming a contact hole, via or trench in a layer of a device in an integrated circuit includes the steps of forming a sacrificial topology on a substrate by duplicating at least a portion of a structure of the device while substituting a material substantially free of elemental silicon for any elemental silicon present in the device to be monitored, etching the sacrificial topology at least to the substrate, removing at least a portion of the sacrificial topology, and inspecting the substrate using a wafer surface inspection tool. The substituted material, such as a dielectric material, can be easily etched and removed from the substrate, as compared to polysilicon. The etching step preferably creates an indentation in the substrate that is readily detectable by the wafer surface inspection tool. The etching step is preferably a selective etching step, having a selectivity of at least 10:1. The actual devices are then formed using the same or substantially the same process parameters as were used in forming the sacrificial topology of the monitor according to the present invention, thus insuring that properly formed contact holes, vias and/or trenches will also be formed in the actual device or devices.

9 Claims, 5 Drawing Sheets

CONTACT MONITOR, METHOD OF
FORMING SAME AND METHOD OF
ANALYZING CONTACT-, VIA-AND/OR
TRENCH-FORMING PROCESSES IN AN
INTEGRATED CIRCUIT

This application claims priority from Provisional Application No. 60/083,347 filed Apr. 28, 1998 and entitled *CONTACT MONITOR, METHOD OF FORMING SAME AND METHOD OF ANALYZING CONTACT-, VIA- AND/ OR TRENCH-FORMING PROCESSES IN AN INTEGRATED CIRCUIT.*

BACKGROUND OF THE INVENTION

1. Field of the Invention

This invention relates to the formation of contact holes, vias and trenches in semiconductor devices. More particularly, the present invention relates to methods and devices for determining and/or identifying defects in processes for forming contact holes, vias or trenches in layers of integrated circuits.

2. Description of the Related Art

The fabrication of semiconductor devices often requires the formation of contact holes, vias and/or trenches to electrically interconnect different layers of semiconductor devices or to interconnect a layer to an underlying substrate. Such contact holes, vias and trenches may be filled with an electrically (semi)conducting material such as, for example, metal (e.g., aluminum, tungsten, copper, etc.) to electrically interconnect metalization layers or to electrically connect such a layer to the substrate. The proper formation of such contact holes, vias and trenches, therefore, is essential for the formation of good electrical interconnects. Faulty contact holes, vias and trenches may be formed by, for example, phenomena such as silicon "grass", for example, wherein spike and spire-like structures remain at the bottom of the contact hole after the contact-forming etch step. Other causes of such faulty contact holes are believed to be related to stepper focus issues, film voids and uniformity problems that change the etch rate and that lead to malformed or missing contact holes, blocked nitride etches and etcher temperature control problems that lead to a non-uniform etch rates and/or polymer build-up problems, to name a few common causes.

The quality of deep (high aspect ratio) sub-micron contact holes is critical to the yield of the underlying process. Indeed, using 0.25-micron technology, for example, a typical die may contain in excess of 10 million contact holes. It is, therefore, essential to ensure that the process steps employed to create such contact holes are optimized and create good electrical contacts between the appropriate layers.

A conventional method of validating the presence and electrical functionality of the contact holes is to fully complete the IC manufacturing process and then to perform conventional electrical testing to determine bit failures. However, such conventional electrical testing does not necessarily test or analyze all contact holes for electrical conductivity. Moreover, the time necessary to complete the manufacturing process and to electrically test the devices is often on the order of about three to four weeks. Thereafter, should process parameters require adjustments because of an unacceptably high bit failure rate, for example, this manufacturing, test and defect analysis cycle must be repeated, consuming another three to four weeks, leading to delays in bringing new products to market and competitive disadvantage. These delays are onerous, therefore, not only in terms of the time necessary to validate the process parameters, but also in terms of the high costs associated with such manufacturing and extended testing cycles.

Conventionally, to properly diagnose the underlying cause of the detected bit failures, it has been necessary to employ, for example, Scanning Electron Microscopy (hereafter "SEM") or Tunneling Electron Microscopy (hereafter "TEM") to accurately visualize the bottom of the via, contact hole, trench or other high aspect ratio structure. Such devices, although effective in resolving most defect structures at the bottom of such contact holes, are slow and expensive, costing on the order of about $10 million apiece.

Clearly, there has been a long felt need for devices and methods to detect and analyze such contact holes, vias and trenches that do not occasion such large expenditures of time and money. For such methods and devices to be effective, however, they should be able to measure all types of contact holes to silicon (and optionally, to a local interconnect structure and/or metallization layer other than the uppermost metal layer) and cover the entire wafer (or alternatively, a statistically significant percentage of and/or number of locations on a wafer). The current alternatives to SEM or TEM-based instruments include conventional optical wafer defect inspection tools, such as the ILM-2230, or KLA®-2132 or 2138 wafer inspection tools commercially available from KLA-Tencor Corporation, San Jose, Calif., or such tools as the WF-700 Series Wafer Defect Inspection System commercially available from Applied Materials of Santa Clara, Calif. However, such tools typically detect defects only at the surface of the integrated circuit topography. The high aspect ratio of typical contact holes, vias and/or trenches forecloses the use of such tools, as such wafer surface inspection devices typically lack the depth of focus necessary to resolve the bottom of the contact hole, via and/or trench. To allow such a wafer surface inspection tool to visualize the bottom of such structures, the surrounding structures and/or topography (herein, "topography" generally refers to structures formed on the integrated circuit ["IC"]) must be somehow removed for the tool to visualize the silicon substrate. This has conventionally been difficult, since polysilicon is often used as part of the product wafer topography. Any method used to remove the polysilicon would also remove any exposed silicon substrate and negatively affect the silicon substrate.

An example of one of the common problems encountered in defining the process parameters for creating a clean contact in a semiconductor device is shown in FIG. 1. In the illustrative example shown in FIG. 1, each of the gate structures includes a polysilicon layer 120 and a tetraethyl orthosilicate (hereafter "TEOS") layer 110. Protecting and isolating each of the gate structures is a pair of sidewall spacers 130, which may also be formed of TEOS. Encapsulating the gate and sidewall structures is a silicon nitride layer 140. Formed on the nitride layer 140 is a layer of boron and/or phosphorous-doped oxide, such as borophosphosilicate glass (hereafter "BPSG"). A capping layer of silicon dioxide 180 formed from, for example, TEOS, is deposited on the BPSG 170. After deposition and patterning of a photoresist layer (not shown), an etching step is carried out to form the self-aligned contact hole 160. As shown at reference numeral 165 in FIG. 1, so-called "grass" 165 may remain at the bottom of the contact hole 160, thereby preventing a good electrical contact between the metal layer to be deposited in the contact hole 160 and the underlying silicon substrate 150. The "grass" 165 may be formed of, for example, an insufficiently or non-uniformly etched nitride layer 140 and/or BPSG residue. Such structural defects adversely affect the performance of the resultant device and decrease the overall fabrication yield for that wafer. Similar defects may arise in processes for forming vias and/or trenches. Conventionally, the only way to detect such unwanted "grass" and other unwanted structural malformations was to infer its existence from the results of the electrical conductivity tests and/or to employ expensive and time consuming visualization instruments, such as SEM or TEM-based devices.

What are needed, therefore, are methods and devices to determine and/or identify defects in a process for forming a contact hole, via or trench in a layer of an integrated circuit. What are also needed are devices and methods to validate the integrity of such contact holes, vias and/or trenches that do not depend upon expensive and slow electron microscopy devices and techniques. It is also believed that there has been a long felt need for methods and devices that would allow faster and relatively inexpensive wafer inspection tools to be used to inspect the bottom of such high aspect ratio contact holes, vias and/or trenches, notwithstanding the inherent depth of focus limitations of such devices.

SUMMARY OF THE INVENTION

An object of the present invention, therefore, is to provide methods and devices to determine and/or identify defects in a process for forming a contact hole, via or trench in a layer of an integrated circuit. Another object of the present invention is to provide devices and methods to validate the integrity of such contact holes, vias and/or trenches that do not depend upon expensive and slow electron microscopy devices and techniques. A still further object of the present invention is to provide a topography and methods that would allow faster and relatively inexpensive wafer inspection tools to be used to inspect the bottom of such high aspect ratio contact holes, vias and/or trenches, despite their depth of focus limitations.

In accordance with the above-described objects and those that will be mentioned and will become apparent below, a monitor for determining and/or identifying defects in a process for forming a contact hole, via or trench in a layer of an integrated circuit, according to an embodiment of the present invention, comprises:

a substrate, a base dielectric layer thereon, an optional silicon oxide-containing spacer immediately adjacent thereto, an optional nitride layer thereover, at least one bulk dielectric layer thereover, and the contact hole, via or trench through at least the at least one bulk dielectric layer to the substrate and, an indentation in the substrate at a location corresponding to the hole, via or trench, the indentation having an area correlating to completeness of hole, via or trench formation.

According to further embodiments, the contact hole, via or trench may also be through the optional nitride layer. The indentation is preferably of sufficient depth to be visible with a wafer surface inspection tool when the base dielectric layer and/or the bulk dielectric layer(s) are absent. The depth of the indentation may range from about 25 nm to about 200 nm. The base dielectric layer is preferably of substantially the same dimension as the corresponding structure in the process to be monitored by the monitor. The corresponding structure may comprise polysilicon.

The present invention may also be viewed as a method of monitoring defects in a process for forming a contact hole, via or trench in a layer of a device in an integrated circuit, comprising the steps of:

forming a sacrificial topology on a substrate by duplicating at least a portion of a structure of the device while substituting a material substantially free of elemental silicon for an elemental silicon-containing structure in the device to be monitored;

performing at least one process step to be monitored;

forming an indentation in a structure exposed by the at least one process step;

removing a sufficient portion of the sacrificial topology to inspect the indentation, and inspecting the indentation-containing structure with a wafer surface inspection tool.

According to further embodiments, the process step or steps to be monitored is (are) performed under conditions that result in forming the indentation. The sacrificial topology-forming step may duplicate the step(s) for forming the entire structure of the device to be monitored. The method may monitor an etching step, and the method may comprise an indentation-forming step in the structure exposed by the process step(s), the indentation preferably being sufficiently deep to be visible by the wafer inspection tool. The indentation-forming step may comprise selectively etching the structure exposed by the process step(s) to form an indentation that is sufficiently deep to be visible by a wafer inspection tool. The selective etching step may comprise plasma etching with an etchant comprising HBr and/or Cl. The selective etching step preferably has a selectivity for the structure exposed by the process step(s) to a nitride, an oxide, or both a nitride and an oxide of at least about 10:1. The material substantially free of elemental silicon preferably has a size that is substantially identical to the elemental silicon-containing (e.g., polysilicon) structure in the device made by the process to be monitored. The material substantially free of elemental silicon may comprise a dielectric material.

According to further embodiments, the present invention is also a method of making a sacrificial topology for monitoring defects in a process for forming a hole, via or trench in a layer of a device in an integrated circuit, comprising the steps of:

a) depositing a base layer of material substantially free of elemental silicon on a substrate that may further comprise a first layer thereon;

b) optionally depositing a silicon oxide-containing spacer immediately adjacent thereto, c) optionally depositing a nitride layer thereover;

d) depositing at least one bulk dielectric layer thereover, and e) forming the hole, via or trench through at least the at least one bulk dielectric layer;

f) forming an indentation in the first layer at a location corresponding to the hole, via or trench, the indentation having an area correlating to completeness of hole, via or trench formation.

The base layer may replace an elemental silicon-containing structure in the device made by the process to be monitored. The base material preferably includes at least one dielectric material. Th forming step may include a selective etching step to selectively etch the substrate and/or first layer relative to nitride, oxide, or both nitride and oxide to create the indentation in the first layer. The indentation-forming step may comprise selectively etching the structure exposed by the process step(s) to form an indentation in the substrate sufficiently deep to be visible by a wafer inspection tool. The substrate/first layer may include, e.g., a silicon layer on an insulator substrate, or a nitride layer on a silicon substrate.

According to another embodiment, the present invention is a monitor for determining and/or identifying defects in a process for forming a hole or via in a layer of an integrated circuit, comprising:

a substrate, a base dielectric layer thereon, an optional silicon oxide-containing spacer immediately adjacent thereto, an optional nitride layer thereover, one or more bulk dielectric layers thereover, and the hole or via through at least the bulk dielectric layer(s) and the base dielectric layer.

BRIEF DESCRIPTION OF THE DRAWINGS

For a further understanding of the objects and advantages of the present invention, reference should be made to the following detailed description, taken in conjunction with the accompanying figures, in which.

DESCRIPTION OF THE PREFERRED EMBODIMENTS

Figure 1:
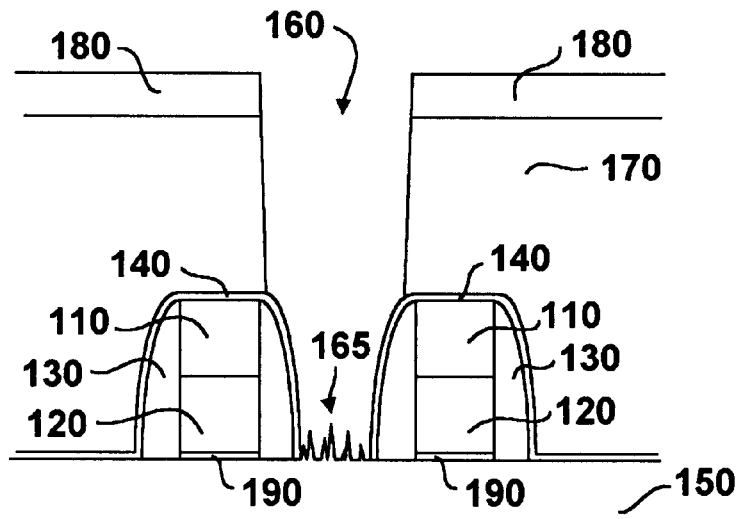
FIG. 1 shows a cross-section of a semiconductor device having a defective contact structure.

A test vehicle (hereafter "monitor") for monitoring the effectiveness of contact and/or via hole formation in a semiconductor or IC manufacturing process and for monitoring the formation of a layer of material that may form local interconnect and contact structures (hereafter "LICON") has been developed. The present monitor may detect deviations in dielectric layer (e.g., silicon dioxide [hereinafter, "oxide"], which may be conventionally doped with boron and/or phosphorous, such as BPSG) deposition, densification, self-aligned contact (hereinafter, "SAC") etch, and silicon nitride etch steps that result in missing or malformed contact holes, vias and/or trenches. Such a test vehicle is significant, as such holes provide a means for forming electrical connections between (semi)conductive layers and/or structures in integrated circuits.

The present monitor generally comprises a sacrificial topography that, after brief etch and stripback processing steps, leaves a characteristic imprint, indentation or depression in the underlying material at the location of the hole. In a preferred embodiment, the imprint, indentation or depression is formed by a short, selective etch of the underlying material.

The monitor may be analyzed using a commercially available optical wafer inspection instrument (such as the optical wafer inspection tools manufactured and sold by KLA-Tencor Corp. or Applied Materials, Inc.) to visualize variations in the contact holes which may be formed by the aforementioned brief etch into the underlying silicon. Such optical wafer inspection tools may detect defects related to the so-called 'yield hole' problem (i.e., insufficient contact and/or insufficient via hole formation in a layer of one or more dielectric materials, wherein some material remains in the bottom of the hole) that may be attributed to a LICON module. In addition, the monitor topography and method according to the present invention may be used to measure the effects of experimental changes to processes for formning contact holes, vias, and/or trenches in a matter of a few days, compared to nearly a month using conventional testing techniques.

The monitor according to the present invention overcomes the topography removal problem alluded to above by substituting an identically-sized or substantially identically-sized silicon oxide-containing structure (or other material that can be selectively removed, relative to silicon) for the polysilicon-containing structures of the actual device to be monitored. The monitor topography, according to the present invention, consists essentially of material(s) that are substantially free of elemental silicon (such as dielectric materials, and typically containing only [doped] oxide and nitride) and that can be removed with standard wet or dry chemicals and/or etchants (preferably wet) used in conventional production processes for removing such dielectric materials. The present invention leaves a small imprint, indentation or depression at the location of the contact hole, via or trench in the underlying layer, such as a silicon substrate. The imprint, indentation or depression in the surface of the silicon substrate is then readily detected by commercially available wafer surface inspection tools, such as the above-mentioned KLA-Tencor optical device. In contrast to conventional methods of detecting malformed contact holes that can only detect a portion of such malformed contact holes, vias or trenches, the present invention allows a conventional wafer inspection tool to automatically analyze every contact or via hole on the wafer, thus providing full coverage for subsequent defect analyses.

Figure 2:
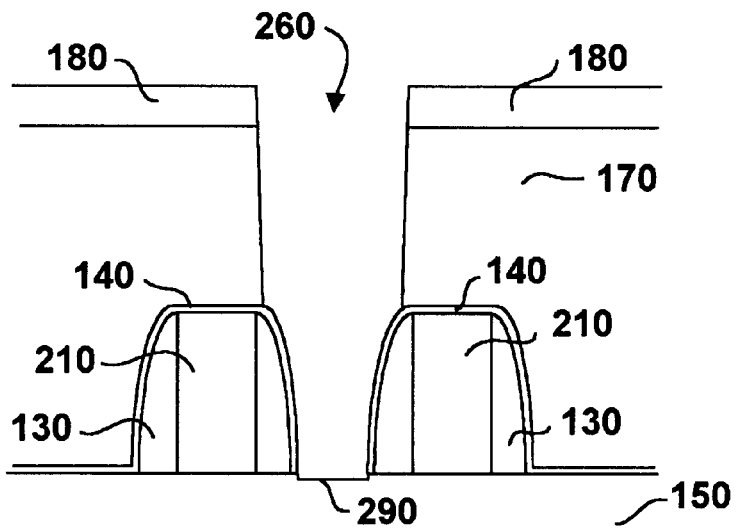
FIG. 2 shows a cross-section of an embodiment of a contact monitor sacrificial topology for determining the integrity of a contact hole, via or trench, according to the present invention.

FIG. 2 shows an embodiment of the monitor sacrificial (removable) topology according to the present invention. As shown therein, the sacrificial topography and the method of forming the sacrificial topography of the present monitor mirrors, to the extent possible, both the structure and the method of making the corresponding device to be monitored. Indeed, once the etching and other parameters are determined, according to the present invention, to produce acceptable contact holes, vias, and/or trenches (i.e., contact holes, vias and/or trenches that allow a (semi)conductor layer therein to make the desired electrical connection with the desired underlying layer), the same process parameters (pressure, power, temperature, backside inert gas pressure, gas flows, etch time and power, layer thickness, photoresist profile, exposure, alignment, to name a few exemplary parameters) can be used to produce the actual devices with a high degree of confidence that the results will be reproducible, i.e., that the same properly formed contact holes, vias and/or trenches seen with the monitor according to the present invention will be reproduced on the actual devices.

As shown in the example of FIG. 2, the topography of the monitor according to the present invention is preferably substantially identical to that of the actual device, save for the gate structure. Indeed, as etching a polysilicon layer or layers (such as shown at 120 in FIG. 1) is problematic, the polysilicon layer has been replaced, according to the present invention, with an oxide substitute 210. Such an oxide substitute 210 consists essentially of material(s) that are substantially free of elemental silicon, such as dielectric materials. Preferably, such oxide substitute 210 contains only (doped) oxides and/or nitrides of silicon and/or aluminum (which may further include oxides and/or nitrides or boron and/or phosphorous) that can be removed with standard wet or dry chemicals and/or etchants (preferably wet) for conventional processes for removing such dielectric materials. In the illustrative example of FIG. 2, the gate structure of (thin) gate oxide 190/stacked polysilicon 120/TEOS 110 of FIG. 1 has been replaced by a substantially identically-sized single base oxide (e.g., $SiO_2$ [preferably formed from TEOS] or other material substantially free of elemental silicon) layer 210 that can easily be etched without adversely affecting the underlying silicon substrate 150. The structures referenced by numerals 130, 140, 150, 170 and 180 are similar to the corresponding structures shown in FIG. 1, and a detailed description of such structures is incorporated herewith.

To form the (self-aligned) contact hole 260 in the monitor topology according to the present invention, the same etch step is carried out as described relative to FIG. 1, at least until the nitride layer 140 is reached. The nitride layer 140 (for example, a $Si_{3N4}$ layer), according to the present invention, may be etched either under standard conditions (the etch conditions and process parameters used in producing the structure 160 of FIG. 1) or for a sufficiently long period of time to form an indentation, depression or other characteristic etch signature 290 in the underlying silicon substrate 150. The indentation 290 is preferably sufficiently deep to be observable with an optical wafer surface inspection tool, such as a KLA-Tencor wafer inspection tool. According to the present invention, additional nitride etch time may allow the wafer inspection tool to detect a contact imprint (depression) in the underlying silicon substrate 150.

Alternatively, a selective silicon etch step may be carried out to form a depression 290 sufficiently deep to be observable with a wafer surface inspection tool. Etchants suitable for such purpose include a HBr/Cl plasma etch and such etchants should preferably have a selectivity for silicon to nitride, oxide, or both nitride and oxide of at least about 10:1 (preferably at least about 20:1, more preferably at least about 50:1). Suitable lengths of time for such a selective silicon etching step may range from about 1 second to about 30 seconds (preferably from about 2 seconds to about 20 seconds, more preferably from about 3 seconds to about 15 seconds) when etching at a rate of from about 20 to about 1000 Å/second (preferably from about 50 to about 750 Å/second, more preferably from about 100 to about 500 Å/second).

After the selective silicon etch or the standard or extended nitride etch step that creates the indentation 290 in the underlying silicon, at least a portion of the sacrificial topography must be removed, meaning that the sacrificial topology must be removed at least down to a level wherein the indentation 290 is visible by the wafer inspection tool (which level may be selected depending upon the depth of focus of the selected wafer inspection tool). Indeed, the sacrificial topology shown in FIG. 2, according to the present invention, must be stripped back at least to a level allowing enough light to reach the indentation 290 to allow it to be resolved by standard optical wafer inspection tools. In one embodiment of the present invention, all of the sacrificial topology shown in FIG. 2 above the substrate 150 is removed, exposing the indentation 290 and the underlying silicon substrate 150.

Figure 3:
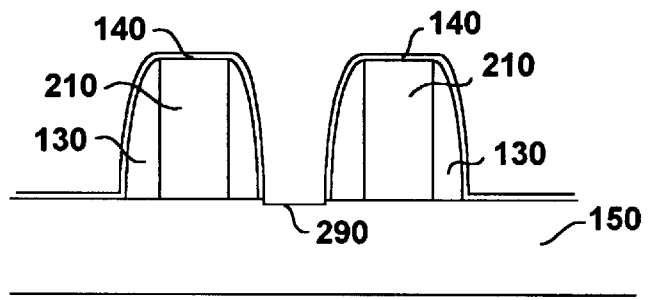
FIG. 3 shows a cross section of the embodiment of the contact monitor sacrificial topology of FIG. 2, wherein a number of layers thereof have been removed.
Figure 4:
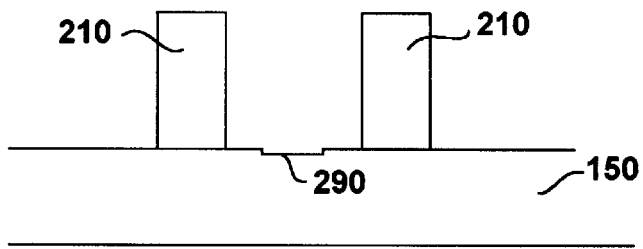
FIG. 4 shows a cross section of the embodiment of the contact monitor sacrificial topology of FIG. 3, wherein a further number of layers thereof have been removed.
Figure 5:
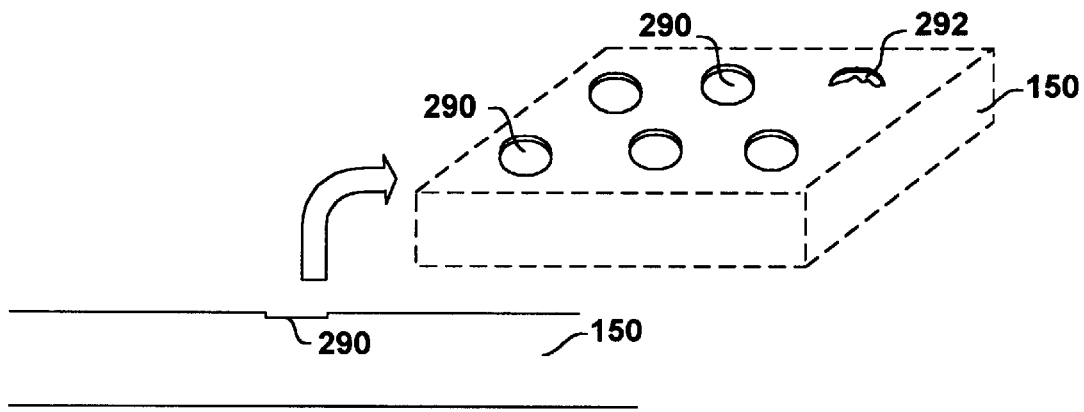
FIG. 5 shows a cross section and a conceptual perspective representation of the embodiment of the contact monitor sacrificial topology of FIG. 3, wherein all sacrificial layers above the substrate have been removed to allow the surface inspection thereof.

As shown in FIG. 3, the TEOS layer 180 and the BPSG layer 170 are removed, leaving the nitride layer 140 exposed. The nitride layer 140 and the sidewall spacers 130 are then removed, as shown in FIG. 4, leaving the base oxide layer 210 exposed. The base oxide layer 210 is then removed, leaving the indentation(s) 290 and the underlying silicon substrate 150 exposed, as shown in FIG. 5. A conventional optical surface inspection tool, such as those manufactured by KLA-Tencor or by Applied Materials, may then used to detect and report the presence, absence and/or proper formation (shape) of the indentations 290 now plainly visible on the substrate 150, as shown in both the cross-sectional view and the conceptual perspective view of the substrate 150 shown in FIG. 5.

The monitor, according to the present invention, is useful in determining not only the presence, absence and/or proper formation of the indentations, but may also be used to test the electrical conductivity and/or resistivity of subsequently formed contact holes, vias and/or trenches. Indeed, a defective contact, via and/or trench may in fact be electrically conductive, but may nevertheless exhibit a higher resistivity than is allowed in product specification of the intended application. For example, although a contact hole, via and/or trench may form an electrically conductive pathway to an underlying layer (e.g., the substrate) and/or structure, the pathway may exhibit an impermissibly high resistance for the application to which it is intended, such as high speed and/or low voltage circuits, for example. Toward that end, the present monitor allows the testing of not only the presence or absence of the indentations 290, but also allows the wafer inspection tool to inspect and report on, for example, the percentage of the area of indentation 290 observed after forming and removing the sacrificial topology, relative to a theoretical indentation area. The theoretical indentation area, in this case, may be defined as the area of a perfectly formed indentation 290.

In this manner, tests may be devised to "pass" or "fail" contact hole, via and/or trench-forming processes, based upon the area of the indentation 290 observed after forming and removing the monitor according to the present invention, relative to a theoretical area of a perfectly formed indentation. For example, a most permissive test may require that the area of the indentation 290 formed after formation and removal of the sacrificial topology (monitor) according to the present invention be only 10% relative to theoretical (e.g., relative to the area of a perfectly formed indentation 290). Other tests may require 50%, 75% or some other predetermined percentage area of the indentation 290, relative to theoretical.

The percentage area of the indentation 290 observed with the surface inspection tool may constitute the entire test, or may be correlated with electrical resistivity. Indeed, a mal-formed indentation, such as indentation 292 in FIG. 5, having an area of only 10% or 50% relative to theoretical, for example, may exhibit a higher resistivity than an indentation having an area equal to or approaching the theoretical maximum area of a perfectly formed indentation 290.

Alternatively, the resistivity of a contact, via and/or trench formed after the formation and removal of the monitor according to the present invention may be directly utilized as the determinative test. For example, after the sacrificial topology and the indentation 290 of FIG. 2 are formed, a layer of electrically conductive material may be deposited within the indentation 290. Thereafter, the resistance between the deposited layer of electrically conductive material and the underlying layer 150 of the contact, via and/or trench may be measured. The measured resistance of the contact, via and/or trench may then be evaluated relative to allowed resistance values for the application in question. The sacrificial topology of FIG. 2 may then be removed and the electrical resistance measurements obtained may then optionally be correlated with the surface area of the indentations 290 observed with a wafer surface inspection tool. The contact hole, via and/or trench-forming processes may then be changed, if needed, to form acceptable contact holes, vias and/or trenches.

Thereafter, when the process parameters have been optimized to reliably and/or consistently produce indentations 290 (which may have at least a predetermined or threshold area correlating to completeness of hole, via or trench formation) in the silicon substrate 150, the process parameters can be fixed and/or saved. The actual device may then be produced using the saved parameters or substantially the same saved process parameters, with a high degree of confidence that the substantially unchanged contact hole, via and/or trench-forming process will also reliably form holes, vias and/or trenches in the actual devices made by the process to be monitored. This is because the process parameters used to create the monitor are substantially identical to those used to create the monitor sacrificial topology, save for the substitution of an identically or near identically-sized silicon oxide-containing structure (or other material that can be selectively removed, relative to silicon) for any elemental silicon-containing structures in the device to be monitored. Such substituted material (see reference numeral 210 in FIG. 2, for example), according to the present invention, consists essentially of material(s) that are substantially free of elemental silicon (such as dielectric materials, and typically containing only [doped] oxide and/or nitride) and that can be removed with standard wet or dry chemicals and/or etchants (preferably wet) used in conventional production processes for removing such dielectric materials.

Figure 6:
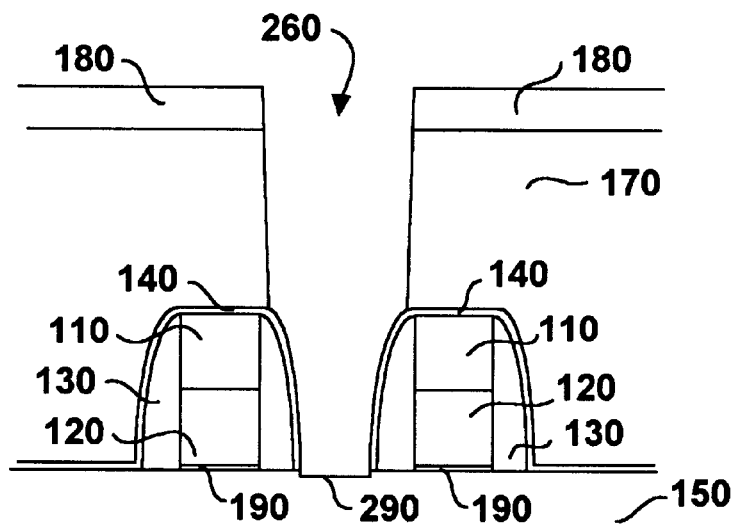
FIG. 6 shows a cross-section of a semiconductor device constructed after having validated the proper formation of a constituent contact hole thereof using the contact monitor sacrificial topology according to the present invention.

As shown in FIG. 6, the actual device is then preferably fabricated using substantially the same process parameters as were used in forming the sacrificial topology of the monitor according to the present invention shown in FIG. 2. The structure of the actual device shown in FIG. 6 is the substantially the same as that of FIG. 2, save for the presence of the polysilicon layer 130. Indeed, instead of the thick base oxide layer 210 of FIGS. 2–4, one may form a thin gate oxide 190, a stacked polysilicon 120—TEOS 110 structure to create the gate structures shown in FIG. 6. Moreover, the selective silicon etch step (and/or the standard or the extended nitride etch) that created the indentation 290 in the silicon substrate 150 in FIGS. 2–5 may also be carried out in forming the actual device shown in FIG. 6, thereby forming a corresponding indentation 290 in the underlying silicon substrate 150 of the actual device. By maintaining substantially the same process parameters employed to create the indentation 290 in the underlying silicon substrate in FIGS. 2–5, the same properly-formed contact holes, vias or trenches whose integrity was validated by forming and removing the sacrificial monitor topology according to the present invention, may also be created in the actual devices, as shown in FIG. 6.

Steps that are unique to forming the monitor structure (shown in FIG. 2), as compared to the corresponding polysilicon gate-containing structure formed by the manufacturing process to be monitored (such as shown, for example, in FIG. 6) include the deposition of a base dielectric (oxide) material 210 on the substrate 150 and the etching of the base dielectric material 210 in accordance with polysilicon/oxide etch step(s) in manufacturing process to be monitored. Thereafter, one or more (doped) oxide layers (170, 180) may be deposited and the (doped) oxide layers (170, 180) may then be etched sufficiently to form a detectable or observable depression 290 in the substrate 150.

When the manufacturing process involves a nitride layer, the unique steps may include the deposition of a base dielectric material 210 on the substrate 150 and the etching of the base dielectric material 210 in accordance with polysilicon/oxide etch step(s) in the manufacturing process to be monitored. Thereafter, the nitride layer (for example, silicon nitride layer 140 in FIG. 2) may be deposited, followed by the deposition of one or more (doped) oxide layers (such as layers 170, 180 in FIG. 2) and the oxide layers (170, 180) may be thereafter etched through to form contact holes and the nitride layers etched sufficiently to form a detectable or observable depression 290 in the substrate 150.

When the manufacturing process involves self-aligned contact holes (as shown in FIG. 2), the unique steps of forming the sacrificial topology of the monitor according to the present invention may include the deposition of a base dielectric material 210 on the substrate 150 and the etching of the base dielectric material 210 in accordance with polysilicon/oxide etch step(s) in manufacturing process to be monitored. Thereafter, spacers (such as shown at 130 in FIG. 2) may be formed and a nitride layer (such as shown at 140 in FIG. 2) may be deposited, followed by the deposition of one or more (doped) bulk and/or capping oxide layers, such as shown at 170, 180. The oxide layer(s) may then be etched through to form (self-aligned) contact holes, and the nitride layer 140 and/or the substrate layer 150 may then etched sufficiently to form a detectable or observable depression 290 in the substrate 150.

In one illustrative embodiment, for example, the process flow to construct the sacrificial topology of the monitor according to the present invention may comprise the following steps or a subset thereof, preferably in the order recited:

mark substrate with identification numbers (e.g., lot and/or wafer number; "SMAT");

zero mask deposition and development ("ZRM");

zero mask etch ("ZRME");

deposit base dielectric material (such as $SiO_2$ formed from tetraethyl orthosilicate by conventional means) ("NPOX") alone in place of sequential polysilicon deposition and oxide deposition in manufacturing process to be monitored;

deposit and develop mask in accordance with polysilicon gate-forming step in manufacturing process to be monitored ("P1NM");

etch base dielectric material in accordance with masked polysilicon-oxide etch step in manufacturing process to be monitored ("P1MOXE"), but for a length of time sufficient to etch the entire thickness of the base dielectric material;

for process involving self-aligned contact holes, deposit oxide for spacers in accordance with process to be monitored ("NTSPOX");

densify (heat and/or anneal) spacers ("SPDEN");

anisotropically etch spacer oxide to form spacers ("SPE");

deposit nitride ("NIT9");

deposit B- and/or P-doped oxide (preferably both B- and P-doped oxide; "NBPSG");

density doped oxide ("DEN");

perform chemical mechanical polishing ("CMP") to planarize topography;

deposit capping (preferably undoped) oxide layer ("NCAPOX");

deposit and develop mask for forming local interconnects and/or contact holes ("LICM1");

etch through oxide layers to form (self-aligned) contact holes ("SACETCH");

etch nitride at bottom of (self-aligned) contact holes ("NESS") either under standard conditions or sufficiently long to form a depression deep enough to be observable with the wafer inspection tool; additional nitride etch time may allow the wafer inspection tool to see a contact imprint (depression) into the underlying silicon substrate (for example, in one embodiment, the NESS time was increased to 48 seconds from the standard product etch time of 28 seconds);

alternatively, selectively etch silicon for a sufficiently brief period of time to form a depression sufficiently deep to be observable with the wafer inspection tool; suitable etchants have a selectivity for silicon to nitride, oxide, or both nitride and oxide of at least about 10:1 (preferably at least about 20:1, more preferably at least about 50:1), and suitable lengths of time may be from about 1 to about 30 seconds (preferably from about 2 to about 20 seconds, more preferably from about 3 to about 15 seconds) when etching at a rate of from about 20 to about 1000 Å/second (preferably from about 50 to about 750 Å/second, more preferably from about 100 to about 500 Å/second)

remove remaining topography/structures down to substrate ("STRIPBACK").

A number of examples of forming and using the monitor according to the present invention are presented herewith.

EXAMPLE #1

A monitor was created substituting oxide for polysilicon, and processed using a mask set for a commercially available integrated circuit using a conventional commercial manufacturing process. The chosen integrated circuit and manufacturing process runs at a relatively high volume and tends to suffer the greatest level of yield hole problems of all the manufacturing processes at that manufacturing facility.

Fourteen-wafer lots were started every three days. At densification, odd numbered wafers were processed in one processor while the even numbered wafers were processed in a second processor. Every lot was held at SACETCH. Each day, four wafers were pulled and processed at SACETCH (one on each available SACETCH tool), then the nitride layer was etched, stripped back and then inspected on the KLA wafer inspection tool. Defect inspection showed that 200 defects were identified by the KLA wafer inspection tool and classified as pitting (small, 0.5 $\mu$m pits in the silicon substrate), single missing contact holes, multiple missing contact holes, or shrunken contact holes.

Results: The initial results indicated that the KLA wafer inspection tool is capable of catching small deviations in the appearance of the contact holes, as well as contact holes that are altogether missing. However, the number of these defects (average=30) is lower than the single bit failure rate on the manufactured device. The missing contact holes do not have the same appearance as the failure analysis (FA) stripbacks of product failures. Most defects were found to be etch-block defects, and not the grass- and/or spire-looking defects seen on product (see, e.g., FIG. 1 at reference 165). The most frequent defect caught by the KLA wafer inspection tool, by a large margin, was pit defects. These account for over 90% of the defects found by this method and make it more difficult to find the true level of missing contact holes. This is thought to be caused by the tendency of the extended nitride etch to also etch residual oxide- and/or nitride-containing defects (such as, e.g., "grass;" see FIG. 1 at 165). However, this method is useful for finding relatively gross defects such as pits.

EXAMPLE #2

The SACETCH step of two commercial manufacturing processes was changed to improve the nitride selectivity window by increasing the gap between the powered electrode and the grounded grid in the etcher. However, the implementation of the new SACETCH step resulted in a yield hole problem in these two processes. (Interestingly, the new SACETCH step on the commercial manufacturing process in Example #1 above largely did not affect contact hole formation.) In addition, according to a top down stripback failure analysis, the two new yield hole problems affect a transistor cross-couple contact (having the smallest polysilicon spacing in the circuit) almost exclusively.

A second embodiment of the present monitor was created with the mask of a second commercially available integrated circuit set to analyze the contact hole formation steps of the two additional manufacturing processes. The level of missing contact holes did not reflect the single bit failure rate on the second commercially available product. Therefore, tests were run to determine whether the effectiveness of the monitor to catch missing contact holes is altered by an increased NESS time.

In one experiment, a highly selective (e.g., >20:1, preferably $\geq$50:1) silicon-to-oxide etch replaced increasing the time of NESS. This selective etch was followed by an additional etch performed in a LAM 4400 etcher using standard HBr/Cl silicon etch chemistry to create an observable contact imprint/indentation/depression. To compare the differences between the two methods, wafers with small amounts of oxide "grass" left in the bottom of the contact holes were created by adjusting the SACETCH chemistry.

Wafers were then split between the extended NESS process and the standard NESS+HBr/Cl process. Both wafers were stripped back and analyzed on the KLA wafer inspection tool.

The defect count on the extended NESS wafer was low and consistent with previous wafers run with the process. The NESS+HBr/Cl processed wafer had so many defects that the automatic KLA wafer inspection tool analysis had to be aborted prior to completion. An SEM review of both wafers confirmed that the contact holes appeared to be shallow and malformed on the NESS+HBr/Cl wafer and normal looking on the extended NESS wafer.

The first wafers run with the combination of the second commercially available integrated circuit mask set and the NESS+HBr/Cl process showed a significant increase in the amount of defective contact holes, a change in their appearance, and in type affected. The number of fails increased from an average of 30/wafer to a range of 100 to 15,000/wafer. It is difficult to make a direct comparison to product failure rate data, since product failure is tracked as the number of die failing for bad single or double bits and is an electrical, rather than a visual, failure. This failure rate on the second commercially available integrated circuit averages 250 die/wafer.

SEM photos of the bad contact holes look very similar to the contact imprints in the product stripbacks—partially formed contact holes with a stripe of oxide running down the middle. Unlike the product wafers, which fail the transistor gate cross-couple contact hole predominately, the monitor wafers fail the tap contact hole most frequently. The tap contact hole is located at the tightest spacing area between the polysilicon wordlines. The remaining failures are dispersed, with the transistor gate cross-couple contact holes failing at a rate slightly higher than the tap contact holes. It is unsurprising that the tap contact hole in the monitor appears to fail at a higher rate than the tap contact hole fails on the product, since there is some electrical redundancy in the tap contact hole and the FA stripbacks are strictly electrically failing bits. The monitor according to the present invention, however detects abnormal contact holes whether they are electrical fails or not. Standard NESS followed by a brief, selective silicon etch appears to be a reliable and accurate method for analyzing contact and/or via hole formation processes from a processing or fabrication perspective.

EXAMPLE #3

To further improve the capabilities of the present monitor, it is desirable to eliminate the pit defect. Since the edges of the pits stop when they intersect a polysilicon feature and they sometimes exhibit a spokewheel pattern, the inorganic antireflective coat ("ARC") at P1M was investigated.

Wafers were split between the standard inorganic ARC/photoresist process and photoresist only process. The wafers were etched with a standard P1MOXE recipe, stripped back to silicon and then inspected on the KLA wafer inspection tool. The standard wafer displayed the typical pit pattern, and the resist only wafer was almost defect free. It was apparent that the ARC coat had a defect or a bubble in it that etched much faster than the rest of the ARC. In the monitor process, the P1MOXE etch stops on the silicon substrate and transfers the image of this defect from the ARC to the wafer, where it is picked up by the KLA-Tencor wafer inspection tool used. Consequently, the ARC has been eliminated from the process for making the monitor. This makes (1) the SEM analysis of defects easier, (2) the KLA-Tencor wafer inspection tool defect classification more robust, and (3) the process of Example #2 above (brief, selective Si etch to form contact imprints) even more reliable.

The present monitor, in combination with a wafer inspection tool, meets the following objectives:
- detects slight variations in contact hole appearance, as well as missing contact holes;
- detects the effects of small amounts of residual oxide left in the bottom of the contact after SAC etch;
- detects failures similar in appearance to FA product wafer stripbacks; and
- detects defective contact holes at a level approximating product, although further investigation should determine the correlation between the defects shown by the monitor according to the present invention and product defects, since the monitor captures physical deviations and product defects are typically analyzed only by electrical failures.

The setup and sensitivity parameters for a KLA-Tencor 2132 inspection tool suitable for detecting the indentations left in the substrate after the stripback process (sacrificial monitor topology removal process) are given below. This basic setup duplicates the Baseline Product Setup. A lower pixel size (higher magnification) may advantageously ensure that 100% of the malformed or missing contact holes are detected. Zero size filtering, and adjustment with the defect threshold may be required. Additional information concerning these setup parameters may be obtained from the manufacturer of the device. However, the following setup should be used as a starting point for investigation of malformed and/or missing contact holes, vias and/or trenches.

| | | | | | |
|---|---|---|---|---|---|
| Pixel size: | 0.39 | | | | |
| Threshold: | 45 | | | | |
| Threshold Size: | 1 | | | | |
| Size Filter: | 0.001 | | | | |
| Merge: | 5 | | | | |
| NA Window Size: | 40 | 40 | | | |
| NA Threshold: | 41 | 41 | | | |
| Guard Band: | 3 | 3 | | | |
| Light Mode: | Algo 1 | | | | |
| Histogram Endpoint.: | Manual, | | Low 25 | | High 225 |
| Filter Set: | F2 | | | | |
| In line Filter | | | Ds Filter | | 1 |
| 0 0 0 | | | 0 | 0 0 | 0 0 |
| 0 32 32 | | | 0 | 1 1 | 1 0 |
| 0 32 32 | | | 0 | 1 1 | 1 0 |
| | | | 0 | 1 1 | 1 0 |
| | | | 0 | 0 0 | 0 0 |

Figure 7:
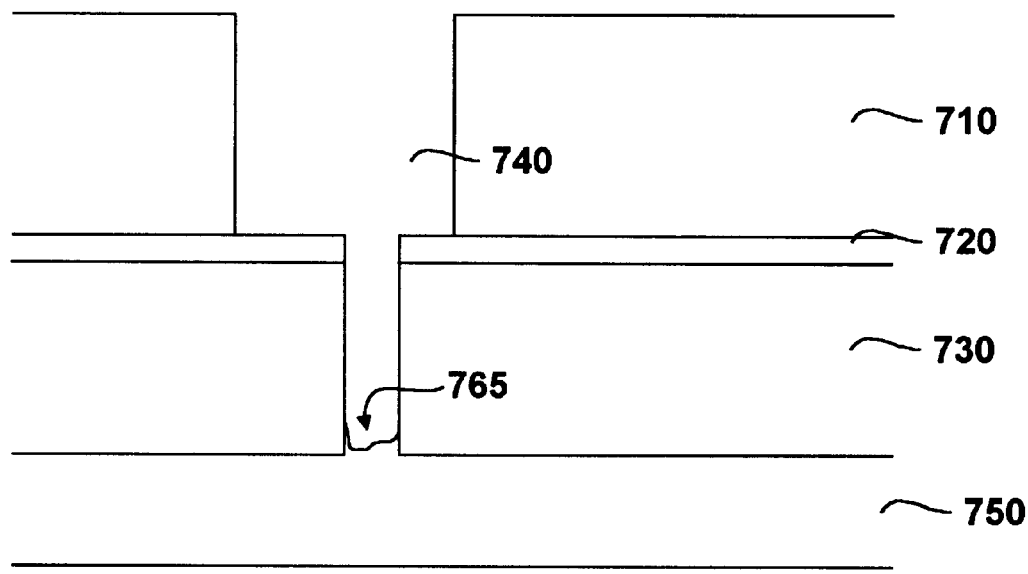
FIG. 7 is a cross-section of a dual damascene metalization layer, showing a defective contact to an underlying layer.

The present invention is also applicable to trench and/or contact formation in so-called damascene or dual-damascene processes. With reference to FIG. 7, trenches and/or contact holes for a metal layer 740 (including, for example, aluminum or copper) is patterned using a dual-damascene method employing a silicon nitride (or other nitride) etch stop layer 720 sandwiched between a first oxide layer 710 and a second oxide layer 730. Diffusion barrier layer(s) may be formed along the metal layer 740, to prevent diffusion between it and the surrounding oxide layers 710, 730 or device terminals, e.g., substrate. A subsequent planarization step using, for example, CMP may then be carried out. Should a malformed contact be formed with the underlying layer 750, such as shown at 765, the metal layer 740 might not be effective in providing an electrical connection thereto.

Figure 8:
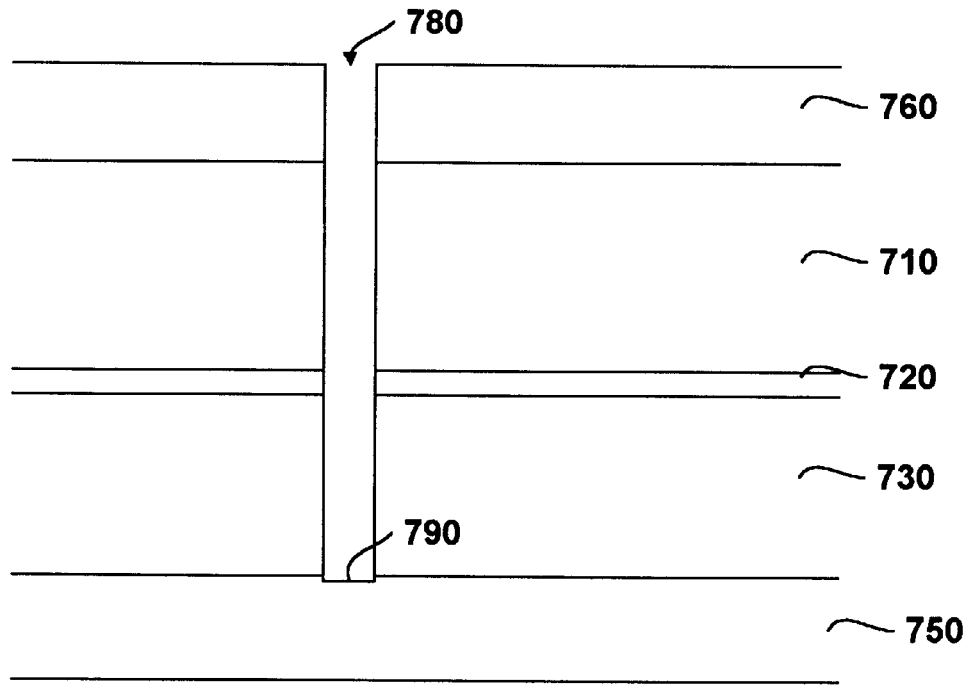
FIG. 8 shows a cross-section of an intermediate step of making a sacrificial topology monitor structure according to the present invention, as applied to a dual damascene process.
Figure 9:
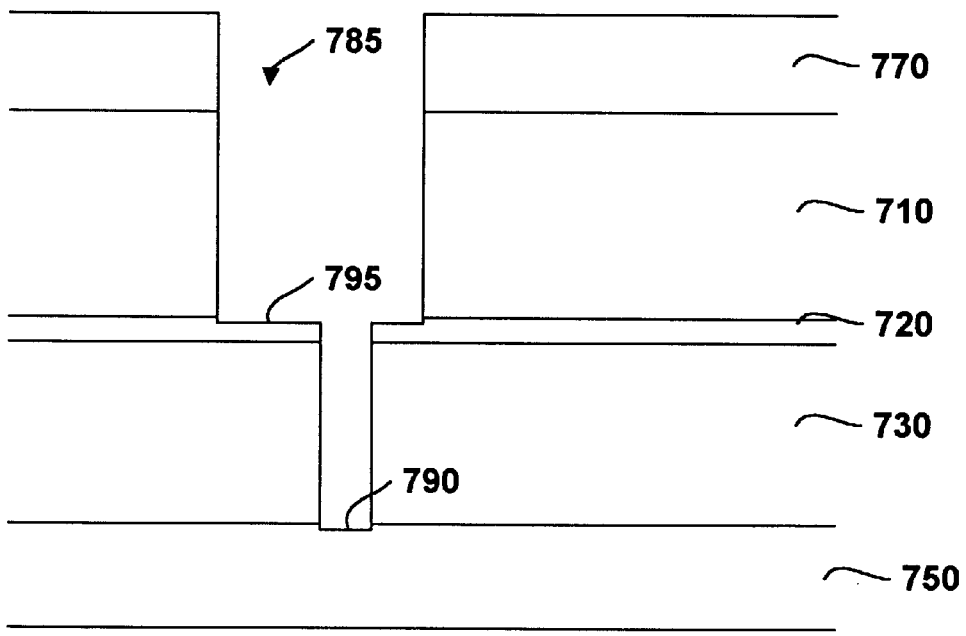
FIG. 9 shows a cross-section of a further intermediate step of making a sacrificial topology monitor structure according to the present invention, as applied to a dual damascene process.

FIGS. 8 and 9 show illustrative example of the use of the sacrificial topology of the monitor according to the present invention, as applied to damascene processes. As shown in FIG. 8, a first photoresist layer 760 is deposited on the first oxide layer 710. Thereafter, one or more etch steps may be carried out to create a via 780 through the first oxide layer 710, the nitride layer 720 and the second oxide layer 730 down to the underlying layer 750. This process may comprise a single etch step (e.g., if a non-selective etchant is employed), or three successive etch steps (e.g., if an etchant is employed that is selective for the material being etched relative to the underlying material).

The etch may then be continued for a sufficient period of time to create an indentation or imprint 790 visible by a wafer surface inspection tool, such as those commercially available from KLA-Tencor, Applied Materials and other suppliers. Alternatively, an etch step having an increased selectivity for the underlying layer 750 relatively to the previously etched material(s) may be carried out to create the characteristic indentation or imprint 790.

Figure 10:
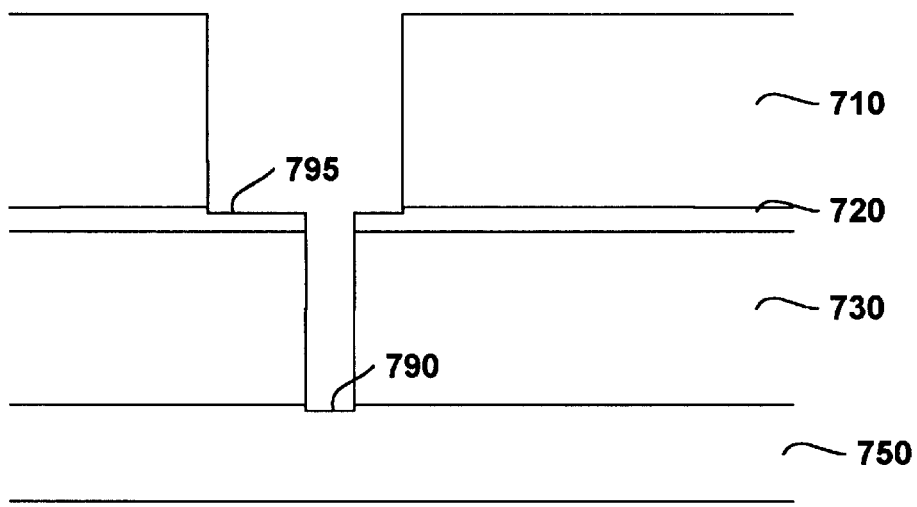
FIG. 10 shows a cross-section of a completed sacrificial topology monitor according to the present invention, as applied to a dual damascene process.

As shown in FIG. 9, a photoresist layer 770 may then be employed to allow a subsequent etch step to create the trench 785. To ensure adequately complete formation of the trench 785, the etch stop nitride layer 720 may itself be etched sufficiently to form an indentation or imprint 795 therein that is sufficiently deep to be visible by a wafer inspection tool. Toward that end, a selective nitride etch step may be carried out. The indentation 795, however, need not be formed, and the indentation or imprint 790 in the underlying layer 750 may be the only such indentation in the monitor. Alternatively, the processes for contact and trench formation may be reversed (i.e., the trench 785 formed first, followed by formation of the contact 780 through the nitride and second oxide layers). FIG. 10 shows the resultant complete sacrificial topology of the monitor of the present invention, as applied to a dual damascene process.

Figure 11:
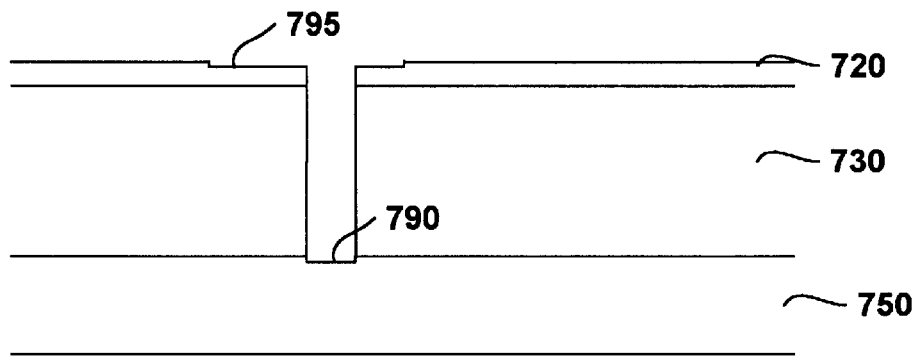
FIG. 11 shows a cross-section of the structure of FIG. 10, after a number of the sacrificial layers thereof have been removed.
Figure 12:
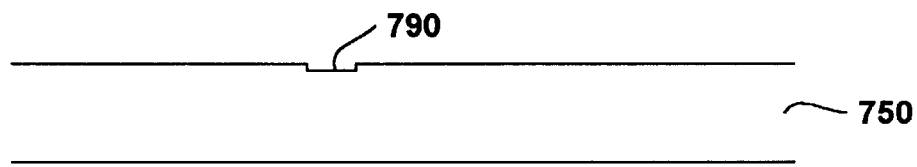
FIG. 12 shows a cross-section of the structure of FIG. 11, after all of the sacrificial topology thereof have been removed, prior to a surface inspection of the underlying layer.

After each of the oxide etch steps (or after both oxide etch steps and the optional nitride etch step have been carried out), the first oxide layer 710 (FIG. 11) may be removed (e.g., by a conventional stripback process) to inspect and/or monitor the trench forming process. Alternatively, one may farther remove the nitride layer 720 and the second oxide layer 730 (FIG. 12) to inspect the contact-forming process. A wafer surface inspection tool may be used, at each of the intermediate steps shown in FIGS. 11 and 12, to ensure the proper formation of the indentation 795 in the nitride layer 720 (FIG. 11) and the indentation 790 in the underlying layer 750 (FIG. 12). Thereafter, when the proper process parameters have been determined, such parameters may be frozen, saved and used substantially unchanged to create the actual damascene interconnects with a high degree of confidence that same properly-formed contacts seen with the monitor of the present invention will be duplicated in the actual product.

With further routine development and experimentation, one can:

Correlate product yield or single/double bit failure rate to monitor defect counts;

demonstrate consistent and repeatable results across multiple wafers;

collect sufficient data to set statistical process control ("SPC") limits;

Correlate monitor analysis results to causes or sources of defects and to appropriate courses of action to correct the same;

correlate defects in and optimize additional topography created by other manufacturing processes (e.g., field oxide growth ["FOX"], oxide deposited between metallization levels ["IOX"], etches relating to such other structures containing one or more dielectric layers or materials such as those created by etching bulk oxide down to the level of a polysilicon gate structure, for example to form a strapping interconnect to the gate [e.g., silicide block mask etch or "SBME"], etc.);

eliminate unnecessary substeps, such as pre- and/or post-cleans, densification (e.g., of spacers), etc.;

identify materials other than oxides that may be substituted for polysilicon;

identify etchants and/or etch processes other than extended nitride etch (e.g., an extended oxide etch wherein the etchant has an oxide:Si etch selectivity of from 2:1 to 10:1, preferably about 3:1 to about 5:1);

demonstrate scalability of different manufacturing processes (e.g., does a standard process step for a 0.25 $\mu$m manufacturing process also work for a 0.18 $\mu$m manufacturing process?);

reduce the scan area of the KLA wafer inspection tool, yet obtain statistically significant results and optimize defect classification with the KLA wafer inspection tool.

While the foregoing detailed description has described preferred embodiments of the present invention, it is to be understood that the above description is illustrative only and not limiting of the disclosed invention. Thus, the present invention to be limited only by the claims as set forth below.

What is claimed is:

1. Method of monitoring defects in a process for forming a contact hole, via or trench in a layer of a device in an integrated circuit, comprising the steps of:

forming a sacrificial topology on a substrate by duplicating at least a portion of a structure of the device while substituting a material substantially free of elemental silicon for an elemental silicon-containing structure in the device to be monitored;

performing at least one process step to be monitored;

forming an indentation in a structure exposed by said at least one process step;

removing a sufficient portion of the sacrificial topology to inspect the indentation, and inspecting the indentation-containing structure with a wafer surface inspection tool.

2. The method of claim 1, wherein said at least one process step to be monitored is performed under conditions that result in forming the indentation.

3. The method of claim 1, wherein said sacrificial topology forming step duplicates steps for forming an entire structure of the device to be monitored.

4. The method of claim 1, wherein an etching step is monitored and wherein the etching step comprises forming an indentation in the structure exposed by said at least one process step, the indentation being sufficiently deep to be visible by the wafer inspection tool.

5. The method of claim 1, wherein the indentation-forming step comprises selectively etching said structure exposed by said at least one process step to form an indentation in said structure exposed by said at least one process step that is sufficiently deep to be visible by the wafer inspection tool.

6. The method of claim 5, wherein the selective etching step comprises plasma etching with an etchant comprising HBr and/or Cl.

7. The method of claim 5, wherein the selective etching step has a selectivity for the structure exposed by said at least one process step to a nitride, an oxide, or both a nitride and an oxide of at least about 10:1.

8. The method of claim 1, wherein the material substantially free of elemental silicon has a size substantially identical to the elemental silicon-containing structure in the device to be monitored.

9. The method of claim 1, wherein the material substantially free of elemental silicon comprises a dielectric material.

* * * * *